United States Patent
Toki

(10) Patent No.: US 6,181,266 B1
(45) Date of Patent: Jan. 30, 2001

(54) D/A CONVERSION METHOD AND A D/A CONVERTER USING PULSE WIDTH MODULATION

(75) Inventor: Nozomi Toki, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/192,926

(22) Filed: Nov. 16, 1998

(30) Foreign Application Priority Data

Nov. 14, 1997 (JP) .................................................... 9-313636

(51) Int. Cl.[7] .................................................. H03M 1/82
(52) U.S. Cl. ............................................ 341/152; 375/238
(58) Field of Search .................................. 341/144, 152; 375/237, 238, 239

(56) References Cited

U.S. PATENT DOCUMENTS

| | | | | |
|---|---|---|---|---|
| 4,061,909 | * | 12/1977 | Bryant | 364/851 |
| 4,095,218 | * | 6/1978 | Crouse | 341/144 |
| 5,764,165 | * | 6/1998 | Buch | 341/53 |

FOREIGN PATENT DOCUMENTS

| | | |
|---|---|---|
| 9-131225 | 7/1984 | (JP) . |
| 1-91515 | 4/1989 | (JP) . |
| 1-93940 | 4/1989 | (JP) . |
| 4-192723 | 7/1992 | (JP) . |
| 7-95088 | 4/1995 | (JP) . |
| 7-303388 | 11/1995 | (JP) . |

* cited by examiner

Primary Examiner—Peguy Jean Pierre
(74) Attorney, Agent, or Firm—Young & Thompson

(57) ABSTRACT

A D/A converter realizes an output analog signal with less ripple within a wide range and includes (a) a bit recognizer for recognizing at least one bit of a digital input signal to thereby produce a pulse width signal and a control signal; (b) a PWM signal generator for generating a PWM signal with a variable pulse width according to a value of the input signal by modulating the input signal according to a PWM process; and (c) an output circuit for outputting an output pulse voltage according to the value of the input signal. The pulse width of the PWM signal is controlled by the pulse width signal, and the output pulse voltage is controlled by the control signal. The pulse width of the PWM signal and the output pulse voltage are controlled in such a way that an area of a pulse of the PWM signal is equal to an area of every other pulse. Each pulse of the PWM signal may be divided into blocks having different values designed for forming a specific expansion characteristic.

16 Claims, 12 Drawing Sheets

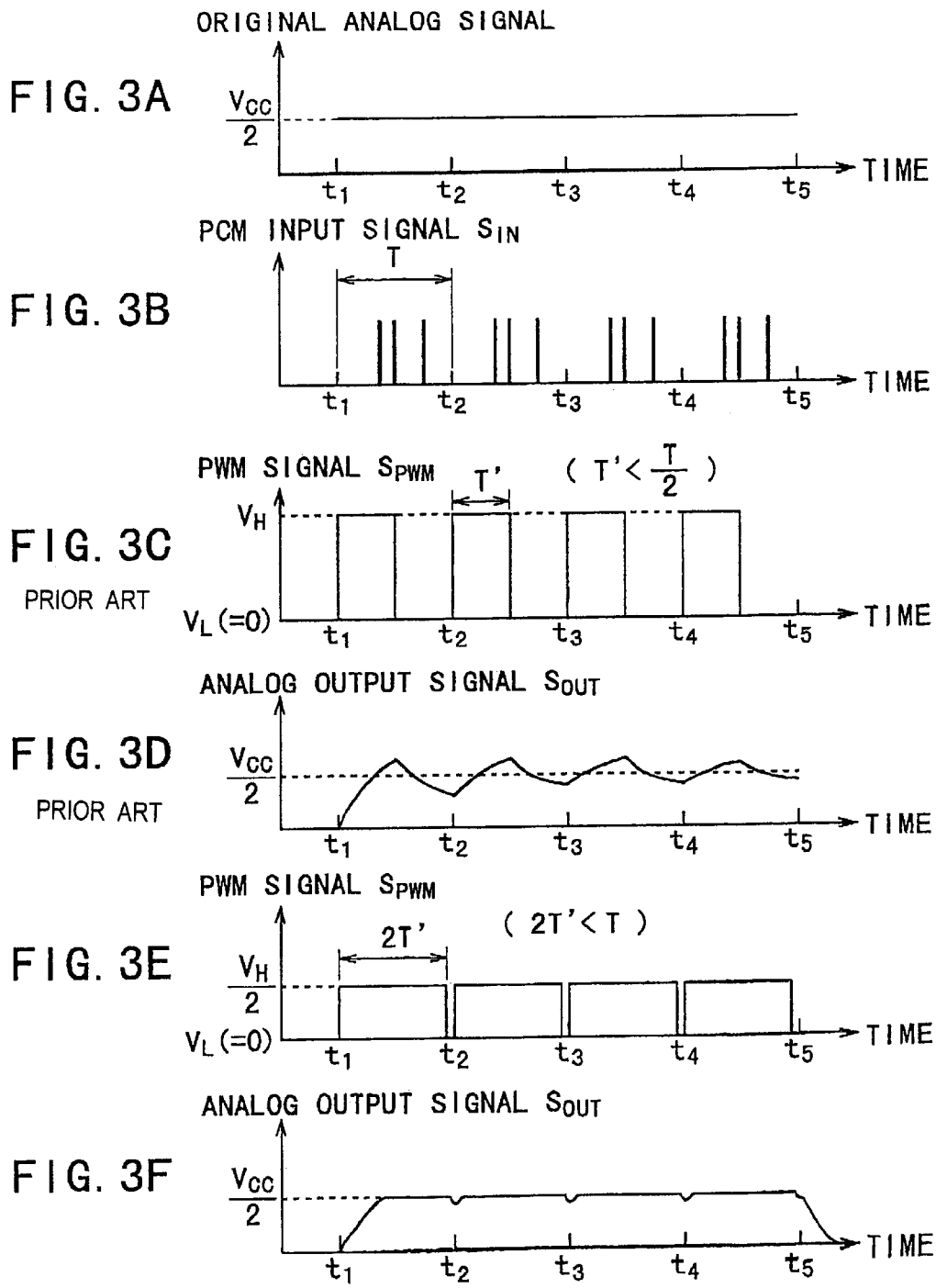

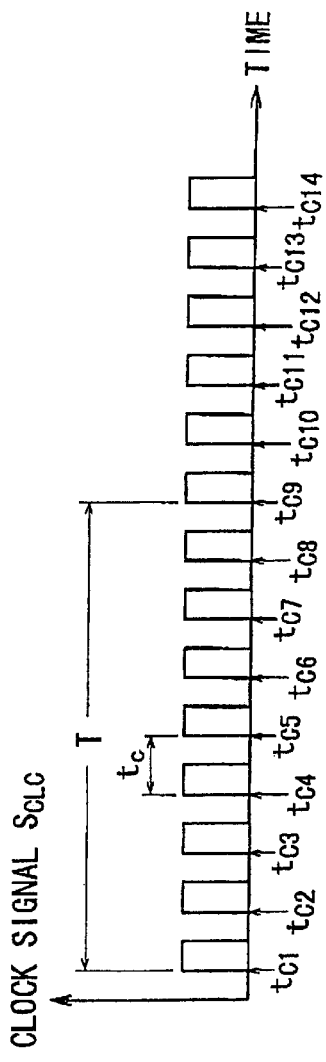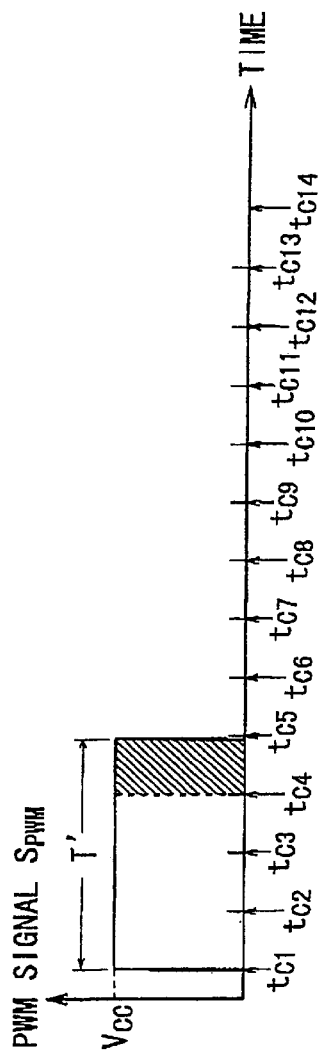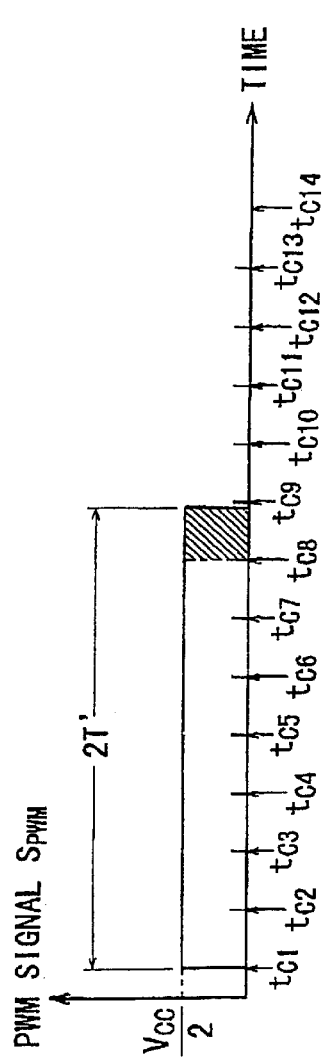
FIG. 4A
FIG. 4B PRIOR ART
FIG. 4C

D/A CONVERSION METHOD AND A D/A CONVERTER USING PULSE WIDTH MODULATION

BACKGROUND OF THE INVENTION

1. Field of the Invention

The present invention relates to a Digital-to-Analog (D/A) conversion and more particularly, to a D/A conversion method and a D/A converter designed for this method, in which Pulse Width Modulation (PWM) is used.

2. Description of the Prior Art

FIG. 1 schematically shows a conventional D/A converter, which is comprised of a Pulse Width Modulator (PWM) circuit 102, a latch circuit 104, and a Low-Pass Filter (LPF) circuit 105.

A digital input signal $S_{IN}$ is applied to the PWM circuit 102. The input signal $S_{IN}$ is a stream of coding pulses produced by modulating or encoding an original analog input signal according to Pulse Code Modulation (PCM). In other words, the input signal $S_{In}$ is a stream of Pulse-Code-Modulated (PCM) pulses.

The PWM circuit 102 receives the digital input signal $S_{IN}$ through an input terminal T1. The PWM circuit 102 modulates the PCM input signal $S_{IN}$ to produce a modulated output signal $S_{PWM}$ having a variable pulse width proportional to the amplitude of the input signal $S_{IN}$. The modulated output signal $S_{PWM}$ is applied to the latch circuit 104.

The latch circuit 104 is formed by a Complementary Metal-Oxide-Semiconductor (CMOS) inverter comprising p- and n-channel MOS Field_effect Transistors (MOSFETs) M1 and M2. Gates of the MOSFETs M1 and M2 are coupled together to be connected to the output terminal of the PWM circuit 102. A source of the n-channel MOSFET M2 is connected to the ground. A source of the p-channel MOSFET M1 is connected to a power supply line applied with a power supply voltage $V_{SS}$. Drains of the MOSFETs M1 and M2 are coupled together to be connected to an input terminal of the LPF circuit 105.

When the PWM output signal $S_{PWM}$ is in the logic high (H) level, the modulated output signal $S_{LC}$ of the latch circuit 104 is in the logic low (L) level. Thus, the output signal $S_{LC}$ is equal to zero or the ground voltage. When the PWM output signal $S_{PWM}$ is i the logic L level, the output signal $S_{LC}$ of the latch circuit 104 is in the logic H level. Thus, the output signal $S_{LC}$ is equal to the power supply voltage $V_{SS}$.

The LPF circuit 105 receives the output signal $S_{LC}$ of the latch circuit 104 and removes its high-frequency components, thereby producing a smooth continuous analog output signal $S_{OUT}$ at an output terminal T2. The analog output signal $S_{OUT}$ is a same as the original analog input signal.

With the conventional D/A converter described above, when the maximum pulse width of each sample of the input signal $S_{IN}$ is $W_S$, the sampling frequency is $f_S$, and the pulse voltage of each sample is $V_P$, the maximum voltage $V_{MOUT}$ of the analog output signal $S_{OUT}$ is given as $$V_{MOUT}=k \times W_S \times V_P, \quad (1)$$

where k is a constant.

Therefore, to increase the maximum voltage $V_{MOUT}$ of the analog output signal $S_{OUT}$, the pulse voltage $V_P$ of each sample needs to be increased.

Also, when the PCM input signal $S_{IN}$ is an n-bit signal (n is a natural number) and the PWM circuit 102 is formed by a counter operated at a frequency $f_c$, the clock frequency $f_c$ of the counter is expressed as $$f_c=f_S \times 2^n \quad (2)$$

This means that the clock frequency $f_c$ of the counter needs to be $2^n$ times as large as the sampling frequency $f_S$. In this case, the magnitude $M_{QS}$ of the quantization step of each sample is given as $$M_{QS}=k \times W_S \times V_P \times (f_S/f_c) \quad (3)$$

Thus, if the clock frequency $f_c$ of the counter is fixed and the sampling frequency $f_S$ is unchanged, the maximum voltage $V_{MOUT}$ of the analog output signal $S_{OUT}$ increases with the increasing voltage $V_P$. In this case, however, there arises a disadvantage that the magnitude $M_{QS}$ of the quantization step of each sample also becomes larger with the increasing pulse voltage $V_P$.

Moreover, if the original analog signal has the highest frequency $f_0$, the highest frequency $f_0$ satisfies the following relationship due to the sampling theorem.

$$2f_0 \leq f_S \quad (4)$$

Therefore, from the above equation (2) and the above inequality (4), the clock frequency $f_c$ of the counter satisfies the following inequality (5).

$$2 \times f_0 \times 2^n \leq f_c \quad (5)$$

It is seen from the inequality (5) that the clock frequency $f_c$ of the counter has the minimum value of $(2 \times f_0 \times 2^n)$. Accordingly, there arises a disadvantage that the latch circuit 104 serving as an output circuit is required to have a switching speed corresponding to the clock signal with a frequency as high as $(2 \times f_0 \times 2^n)$ or higher.

Additionally, the signal-to-noise ratio (S/N) for a linear- or uniform-quantized PCM signal is given by $$S/N=1.7+6B, \quad (6)$$

where B is the number of quantization bits of the PCM signal. Therefore, the S/N of the PCM signal degrades with its decreasing level due to quantization noise. If the number B of the quantization bits is increased to improve the S/N, the total amount of information to be transmitted is increased.

Thus, to improve the S/N of the PCM signal without increasing the total amount of information to be transmitted, there have been developed and practically used the logarithmic compression codes termed "µ-law" and "A-law".

The logarithmic compression code "µ-law" is a 8-bit PCM code having first to eighth bits. The full-scale amplitude of the original analog signal is divided into 15 equal segments to form 16 steps. Each of the segments thus formed is linear- or uniform-quantized to form 16 equal quantization steps. The first bit, i.e., the Most Significant Bit (MSB), of the µ-law code is a sign bit to represent the polarity of the original analog signal. The second to fourth bits of the µ-law code are segment bits to designate one of the 16 segments. The fifth to eighth bits of the µ-law code are step bits to designate one of the 16 quantization steps for a corresponding one of the 16 segments.

The logarithmic compression code "A-law" also is a 8-bit PCM code having first to eighth bits. The full-scale amplitude of the original analog signal is divided into 13 equal segments to form 14 steps. Each of the segments thus formed is linear- or uniform-quantized to form 16 equal quantization steps. The first bit, i.e., the Most Significant Bit (MSB), of the A-law code is a sign bit to represent the polarity of the original analog signal. The second to fourth bits of the A-law code are segment bits to designate one of the 14 segments. The fifth to eighth bits of the A-law code are step bits to designate one of the 16 quantization steps for a corresponding one of the 14 segments.

With the conventional D/A converter shown in FIG. 1, however, there are the following problems.

First, the maximum pulse width of the PWM signal $S_{PWM}$ is determined by the sampling frequency $f_S$. Therefore, to improve the pulse-width resolution of the PWM signal $S_{PWM}$, the clock frequency $f_c$ of the counter serving as the PWM circuit 102, which determines the step number of the variable pulse width of the PWM signal $S_{PWM}$, needs to be raised. In this case, however, there arises a problem that the relating hardware is required to operate at a higher speed and the power consumption is increased.

If the voltage or amplitude of the PWM signal $S_{PWM}$ is increased in order to expand the dynamic range of the analog output signal $S_{OUT}$, the quantization step is increased and as a result, the minimum level of the output signal $S_{OUT}$ becomes higher according to the increased quantization step. Therefore, in this case also, the clock frequency $f_c$ of the counter serving as the SWM circuit 102 needs to be raised for reduction of the quantization step. Thus, there arises the same problem as above.

Second, there is a problem that the highest switching speed of the latch circuit 104, which allows the clock frequency $f_c$ of the counter having the minimum value of $(2 \times f_o \times 2^n)$ to be inputted, limits the highest frequency $f_o$ of the applicable original analog signal.

Third, when the rotation of a motor is controlled by the use of the PWM signal $S_{PWM}$, there is a problem that an uneven rotation of the motor occurs at a low duty of the signal $S_{PWM}$. The uneven rotation is not completely removed, because the analog output signal $S_{OUT}$ contains some ripple at a low duty of the signal $S_{PWM}$ even after a averaging or smoothing operation by the LPF circuit 105.

Fourth, if the applied PCM signal $S_{IN}$ is linearly or uniformly quantized, the quantization noise becomes large at the low level of the signal $S_{IN}$. If the bit number of the PCM signal $S_{IN}$ is increased to suppress the quantization noise, there arises a problem that the total amount of information or data to be transmitted is increased and at the same time, the clock frequency $f_c$ of the counter serving as the PWM circuit 102 needs to be raised. This problem is solved by the use of the above-described logarithmic compression codes termed "$\mu$-law" and "A-law". However, in this case, there arises another problem that a conversion operation to convert the uniformly quantized PCM signal $S_{IN}$ to a logarithmically quantized one is required.

On the other hand, a PWM signal generator circuit applicable to speed or phase control of a motor in a Video Tape Recorder (VTR) is disclosed in the Japanese Non-Examined Patent Publication No. 4-192723 published in July 1992.

In this conventional PWM signal generator circuit, a PWM output signal with a variable pulse width according to an applied digital signal is produced. The PWM output signal has a first voltage corresponding to the logic high (H) level or a second voltage corresponding to the logic low (L) level. Each of the first and second voltages may have two or more different values.

With the conventional PWM signal generator circuit disclosed in the Japanese Non-Examined Patent Publication No. 4-192723, the output voltage range is expanded and the uneven rotation is suppressed due to resolution improvement of the PWM output signal. However, there is a problem that the uneven rotation of the motor is not satisfactorily reduced.

SUMMARY OF THE INVENTION

Accordingly, an object of the present invention is to provide a D/A conversion method and a D/A converter that realize an output analog signal with less ripple within a wide range.

Another object of the present invention is to provide a D/A conversion method and a D/A converter that reduce the highest operation frequency of related hardware and reduce power consumption.

Still another object of the present invention is to provide a D/A conversion method and a D/A converter that expand the dynamic range even at a low clock frequency for a PWM circuit.

A further object of the present invention is to provide a D/A conversion method and a D/A converter that improve the resolution without increasing the clock frequency for a PWM circuit.

A still further object of the present invention is to provide a D/A conversion method and a D/A converter capable of coping with PCM input signals applied with not only linear quantization but also non-linear quantization according to the $\mu$-law and A-law logarithmic compression codes without any conversion process between linear quantization and non-linear quantization.

The above objects together with others not specifically mentioned will become clear to those skilled in the art from the following description.

According to a first aspect of the present invention, a D/A conversion method is provided, which is comprised of the following steps.

(a) At least one bit of a digital input signal is recognized to produce a pulse width signal and a control signal.

(b) A PWM signal with a variable pulse width is generated according to a value of the pulse width signal by modulating the digital input signal according to PWM.

(c) An output pulse voltage is outputted according to the value of the digital input signal.

The pulse width of the PWM signal is controlled by the pulse width signal, and the output pulse voltage is controlled by the control signal.

The pulse width of the PWM signal and the output pulse voltage are changed in such a way that an area of each pulse of the PWM signal is kept unchanged.

With the D/A conversion method according to the first aspect of the present invention, the pulse width of the PWM signal is controlled by the pulse width signal, and the output pulse voltage is controlled by the control signal. Further, the pulse width of the PWM signal and the output pulse voltage are changed in such a way that an area of each pulse of the PWM signal is kept unchanged.

As a result, an output analog signal with less ripple is realized within a wide range. This leads to a reduction in the power consumption.

Also, the resolution of D/A conversion is improved without increasing the clock frequency for the PWM circuit.

In a preferred embodiment of the method according to the first aspect, the output pulse voltage is controlled according to a duty of the PWM signal.

In another preferred embodiment of the method according to the first aspect, the output pulse voltage is controlled in such a way that the output pulse voltage has a half value of a maximum value when the duty of the PWM, signal is less than 50%.

In still another preferred embodiment of the method according to the first aspect, the input signal is a k-bit signal, and the output pulse voltage is divided into $2^n$ steps, where k and n are natural numbers satisfying a relationship of k>n. The variable pulse width of the PWM signal is divided into (k=n) bits. The output pulse voltage is controlled in such a way that the output pulse voltage has a value corresponding to one of the $2^n$ steps when the duty of the PWM signal is less than 50%.

In this case, there is an additional advantage that a wide dynamic range is obtained even at a low clock frequency for the PWM circuit.

In a further preferred embodiment of the method according to the first aspect, each pulse of the PWM signal is divided into blocks having different values, and the values of the blocks are designed to form a specific expansion characteristic.

In this case, there is an additional advantage that this method makes is possible to cope with a PCM input signal applied with non-liner quantization such as $\mu$-law and A-law logarithmic compression codes without any conversion process between linear quantization and non-linear quantization.

In a still further preferred embodiment of the method according to the first aspect, the values of the blocks are designed to form a logarithmic expansion characteristic.

According to a second aspect of the present invention, a D/A converter is provided, which is comprised of (a) a bit recognizer for recognizing at least one bit of a digital input signal to thereby produce a pulse width signal and a control signal; (b) a PWM signal generator for generating a PWM signal with a variable pulse width according to a value of the input signal by modulating the input signal according to a PWM process; and (c) an output circuit for outputting an output pulse voltage according to the value of the input signal.

The pulse width of the PWM signal is controlled by the pulse width signal, and the output pulse voltage is controlled by the control signal. The pulse width of the PWM signal and the output pulse voltage are changed in such a way that an area of each pulse of the PWM signal is kept unchanged.

With the D/A converter according to the second aspect of the present invention, the same advantages as those in the first aspect are obtained because of the same reason as that in the D/A conversion method according to the first aspect of the present invention.

In a preferred embodiment of the converter according to the second aspect, the output pulse voltage is controlled according to a duty of the PWM signal.

In another preferred embodiment of the converter according to the second aspect, the output pulse voltage is controlled in such a way that the output pulse voltage has a half vale of a maximum value when the duty of the PWM signal is less than 50%.

In still another preferred embodiment of the converter according to the second aspect, the input signal is a k-bit signal, and the output pulse voltage is divided into $2^n$ steps, where k and n are natural numbers satisfying a relation ship of k>n. The variable pulse width of the PWM signal is divided into (k–n) bits. The output pulse voltage is controlled in such a way that the output pulse voltage has a value corresponding to one of the $2^n$ steps when the duty of the PWM signal is less than 50%.

In a further preferred embodiment of the converter according to the second aspect, the each pulse of the PWM signal is divided into blocks having different values, and the values of the blocks are designed to form a specific expansion characteristic.

In a still further preferred embodiment of the converter according to the second aspect, the values of the blocks are designed to form a logarithmic expansion characteristic.

BRIEF DESCRIPTION OF THE DRAWINGS

In order that the present invention may be readily carried into effect, it will now be described with reference to the accompanying drawings.

FIG. 3A is a timing diagram showing the original analog signal.

FIG. 3B is a timing diagram showing the PCM input signal $S_{IN}$, each sample of which comprises the PCM coding pulses representing the amplitude of the original analog signal.

FIG. 3C is a timing diagram showing the PWM output signal $S_{PWM}$ of the conventional D/A converter shown in FIG. 1.

FIG. 3D is a timing diagram showing the analog output signal $S_{OUT}$ of the conventional D/A converter shown in FIG. 1.

FIG. 3E is a timing diagram showing the PWM output signal $S_{PWM}$ of the D/A converter according to the first embodiment.

FIG. 3F is a timing diagram showing the analog output signal $S_{OUT}$ of the D/A converter according to the first embodiment.

FIG. 4A is a timing diagram showing the clock signal.

FIG. 4B is a timing diagram showing the PWM output signal $S_{PWM}$ of the conventional D/A converter shown in FIG. 1.

FIG. 4C is a timing diagram showing the PWM output signal $S_{PWM}$ of the D/A converter according to the first embodiment.

DETAILED DESCRIPTION OF THE PREFERRED EMBODIMENTS

Figure 1:
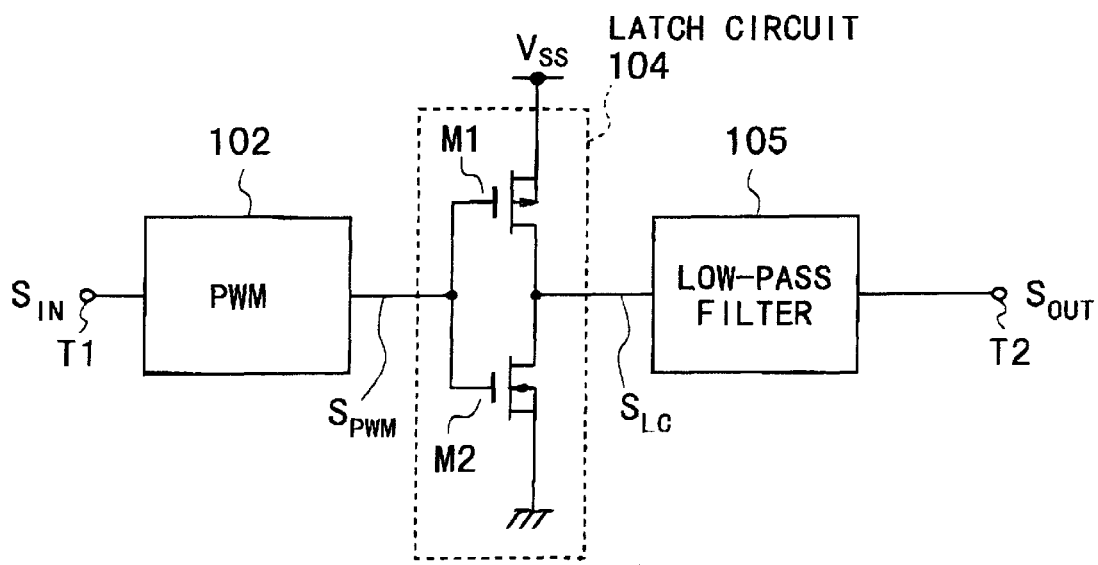
FIG. 1 is a block diagram showing a conventional D/A converter.

Preferred embodiments of the present invention will be described below referring to the drawings attached.

Figure 2:
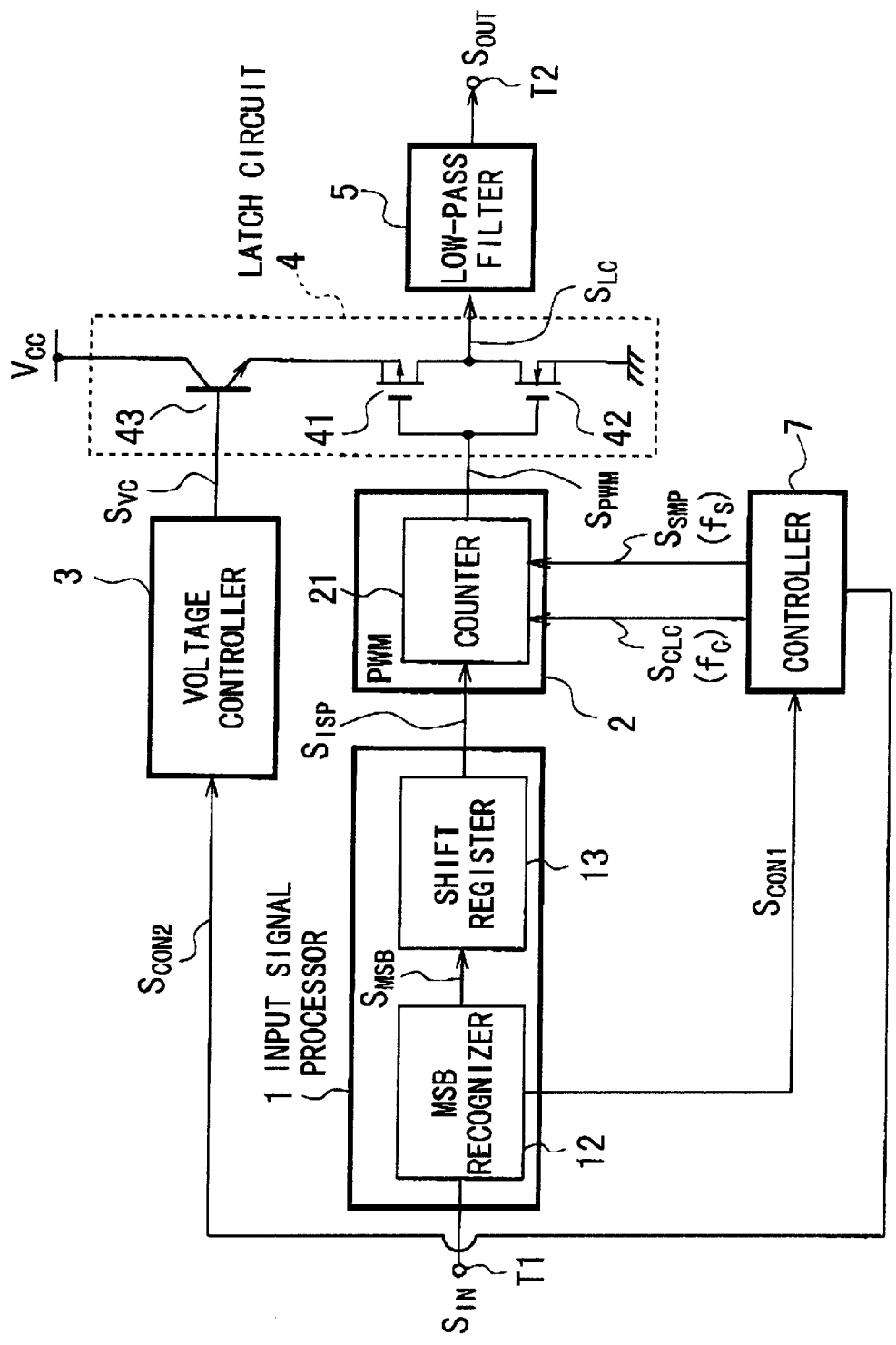
FIG. 2 is a block diagram showing a D/A converter according to a first embodiment of the present invention.

A D/A converter according to a first embodiment of the present invention has a configuration as shown in FIG. 2.

As shown in FIG. 1, this D/A converter is comprised of an input signal processor 1, a PWM circuit 2, a voltage controller 3, a latch circuit 4 serving as a sample-and-hold (S/H) circuit, and a LPF circuit 5. Reference symbols T1 and T2 denote input and output terminals of the D/A converter, respectively.

A digital input signal $S_{IN}$ is applied to the input signal processor 1 through the input terminal T1. Here, the input signal $S_{IN}$ is an n-bit PCM signal, where n is a natural number. Therefore, the input signal $S_{IN}$ is formed by a stream of bits or coding pulses produced by modulating or encoding an original analog signal according to the PCM coding process. A part of the successive bits or coding pulses included in a sampling period T represents the amplitude of each sample of the original analog signal, where the samples of the original analog signal are produced by sampling the original analog signal at a sampling frequency $f_s(=1/T)$.

As shown in FIG. 2, the input signal processor 1 has a MSB recognizer 12 and a shift register 13.

The MSB recognizer 12 checks the MSB of the input signal $S_{IN}$ and recognizes whether the value of the MSB is "1" or "0". Then, the MSB recognizer 12 sends a control signal $S_{CON1}$ to a controller 7 which is typically formed by a Central Processing Unit (CPU) or Digital Signal Processor (DSP). In response to the control signal $S_{CON1}$, the controller 7 sends a control signal $S_{CON2}$ to the voltage controller 3.

On the other hand, the MSB recognizer 12 transmits serial bit data of the input signal $S_{IN}$ to the shift register 13 as an output signal $S_{MSB}$ of the MSB recognizer 12.

The shift register 13 receives the serial bit data of the input signal $S_{IN}$ through the output signal $S_{MSB}$ of the MSB recognizer 12, and converts the serial bit data to a parallel bit data. The parallel bit data of the input signal $S_{IN}$ is sent to the PWM circuit 21 as an output signal $S_{ISP}$ of the input signal processor 1.

The PWM circuit 2 includes a counter 21 for counting the number of an applied, pulsed clock signal $S_{CLC}$ with a clock frequency $f_c$. The count of the counter 21 is reset by a pulsed sampling signal $S_{SMP}$ with the same sampling frequency $f_s$ as used in the formation or PCM process of the digital input signal $S_{IN}$. In other words, the counter 21 repeats the same counting operation during each sampling period T.

The pulsed clock signal $S_{CLC}$ and the pulsed sampling signal $S_{SMP}$ are generated by the controller 7 and then, they are sent to the counter 21.

The counter 21 receives the parallel bit data of the input signal $S_{IN}$ through the output signal $S_{ISP}$ of the input signal processor 1 as a final count value. Then, the counter 21 starts the counting operation from a specific initial value (e.g., 0) to the final count value thus received. After the count value is equal to the final value, the counting operation is stopped.

The counter 21 outputs a PWM output signal $S_{PWM}$ with a variable pulse width to the latch circuit 4. The pulse width of the PWM output signal $S_{PWM}$ at each quantized sample is proportional to the amplitude of the original analog signal at each sample.

During the counting operation of the counter 21, the output signal $S_{PWM}$ of the counter 21 or the PWM circuit 2 is in the logic low L level. Therefore, an output signal $S_{LC}$ of the latch circuit 4 is in the logic H level and has a value of $V_H$, i.e., a power supply voltage $V_{CC}$ (V) applied to the latch circuit 4. After the counting operation, the output signal $S_{PWM}$ of the counter 21 is in the logic H level. Therefore, the output signal $S_{LC}$ of the latch circuit 4 is in the logic L level and has a value of $V_L$, i.e., 0 (V).

The latch circuit 4, which serves as an output circuit of the D/A converter, is formed by a CMOS inverter comprising p- and n-channel MOSFETs 41 and 42. Gates of the MOSFETs 41 and 42 are coupled together to be connected to the output terminal of the PWM circuit 2 or counter 21. A source of the n-channel MOSFET 42 is connected to the ground. A source of the p-channel MOSFET 41 is connected to a power supply line applied with the power supply voltage $V_{CC}$ through an npn-type bipolar transistor 43. Drains of the MOSFETs 41 and 42 are coupled together to be connected to an input terminal of the LPF circuit 5.

The source of the p-channel MOSFET 41 is connected to an emitter of the transistor 43. A collector of the transistor 43 is connected to the power supply line of $V_{CC}$. A base of the transistor 43 is connected to the output terminal of the voltage controller 3.

Since the output signal $S_{PWM}$ of the counter 21 is in the logic L level during the counting operation of the counter 21, the output signal $S_{LC}$ of the latch circuit 4 is equal to the power supply voltage $V_{CC}$ (V). After the counting operation, the output signal $S_{PWM}$ of the counter 21 is in the logic H level and therefore, the output signal $S_{LC}$ of the latch circuit 4 is equal to 0 (V). Thus, the output signal $S_{LC}$ has a stairstep representation of the original analog signal.

The LPF circuit 5 receives the stairstep output signal $S_{LC}$ of the latch circuit 4 and removes its high-frequency components with frequencies above one half the sampling frequency $f_s$, thereby producing a smooth continuous analog output signal $S_{OUT}$ at the output terminal T2. The analog output signal $S_{OUT}$ thus outputted is the same as the original analog signal. The smooth continuous analog output signal $S_{OUT}$ is produced by integrating or averaging the stairstep output signal $S_{LC}$ during each sampling period T in the LPF circuit 5.

Next, the operation of the D/A converter according to the first embodiment is explained below with reference to FIGS. 3A to 3F and 4A to 4C.

FIG. 3A shows the original analog signal, in which the amplitude of this signal is equal to $(V_{cc}/2)$ at the equal-spaced times $t_1$, $t_2$, $t_3$, and $t_4$.

FIG. 3B shows the PCM input signal $S_{IN}$, each sample of which comprises the PCM coding pulses representing the amplitude of the original analog signal at the times $t_1$, $t_2$, $t_3$, and $t_4$.

FIG. 3C shows the PWM output signal $S_{PWM}$, each quantized sample of which has a pulse width of T less than T/2. This representation corresponds to the conventional D/A converter shown in FIG. 1.

FIG. 3D shows the analog output signal $S_{OUT}$, in which a large ripple is generated at each sample. This representation corresponds to the conventional D/A converter shown in FIG. 1.

FIG. 3E shows the PWM output signal $S_{PWM}$, each quantized sample of which has a pulse width of 2T' less than T.

FIG. 3F shows the analog output signal $S_{OUT}$, in which a slight ripple is generated at each sample.

FIG. 4A shows the clock signal $S_{CLK}$ with a clocking period $t_c$, in which a stream of clock pulses are illustrated at the times $t_{c1}$ to $t_{c14}$. As seen from FIG. 4A, the sampling period T has a length equal to 8 clock pulses, here.

FIG. 4B shows the PWM output signal $S_{PWM}$ with a pulse width of T' and an amplitude of $V_{cc}$.

FIG. 4C shows the PWM output signal $S_{PWM}$ with a pulse width of 2T' and an amplitude of ($V_{cc}/2$).

Figure 5A:
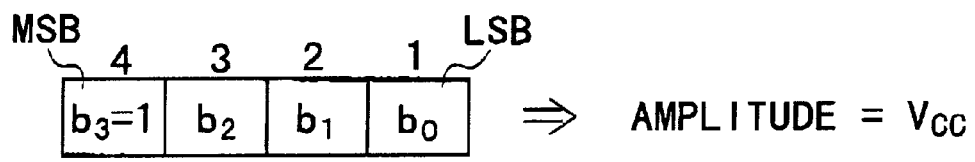
FIGS. 5A and 5B are schematic diagrams showing the shift of the bits of the PCM input signal in the operation of the D/A converter according to the first embodiment, respectively.
Figure 5B:
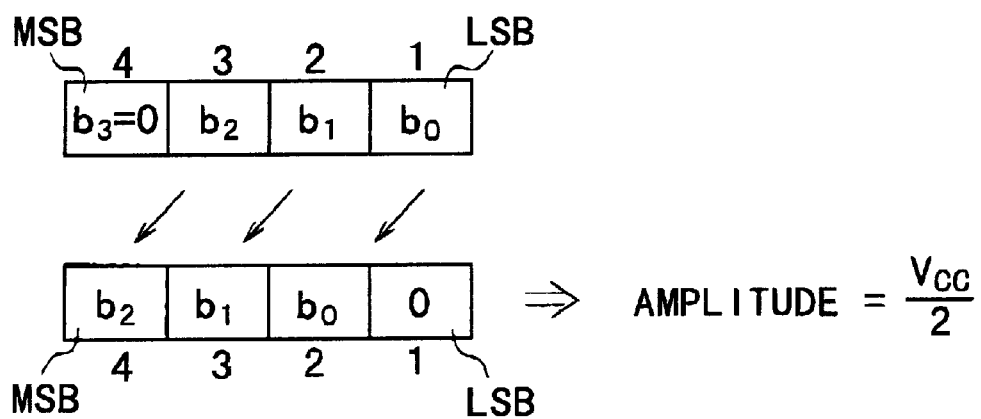

Here, it is supposed that the applied PCM input signal $S_{IN}$ is a 4-bit signal of bits $b_3$, $b_2$, $b_1$, and $b_0$, as shown in FIGS. 5A and 5B. Here, the format of the signal $S_{IN}$ is represented as [$b_3$, $b_2$, $b_1$, $b_0$]. The MSB is the bit $b_3$ and the Least Significant Bit (LSB) is the bit $b_0$. In response to this, the shift register 13 is a 4-bit register.

First, the MSB recognizer 12 of the input signal processor 1 recognizes the value of MSB (i.e., $b_3$) of the input signal $S_{IN}$.

When the MSB of the applied PCM input signal $S_{IN}$ has a value "1" (i.e., $b_3$=1), as shown in FIG. 5A, the serial bit data $S_{12}$ of [$b_3$, $b_2$, $b_1$, $b_0$] are sent to the 4-bit shift register 13 where no change is applied thereto.

The serial bit data $S_{12}$ of [$b_3$, $b_2$, $b_1$, $b_0$] are converted to the parallel bit data by the shift register 13. Then, the parallel bit data is applied to the counter 21 of the PWM circuit 2 as the final count value through the output signal $S_{ISP}$ of the input signal processor 1.

After the count of the counter 21 is reset by the sampling signal $S_{SMP}$, the counter 21 starts to count the pulses of the clock signal $S_{CLC}$ upward from the initial value (e.g., 0) until the count value is equal to the final value (i.e., the value represented by the parallel bit data) during each sampling period T. The duration or period of the counting operation, which is equal to the pulse width of the PWM output signal $S_{PWM}$, is proportional to the amplitude value of the original analog signal of each sample. In this case, since the MSB has a value "1", the duty of the PWM output signal $S_{PWM}$ is greater than 50%.

During the counting operation, the PWM output signal $S_{PWM}$ is kept in the logic L level, thereby holding the output signal $S_{LC}$ of the latch circuit 4 in the logic H level ($V_H$).

On the other hand, the fact that the MSB of the applied PCM input signal $S_{IN}$ has a value "1" (i.e., $b_3$=1) is transmitted to the controller 7 through the control signal $S_{CON1}$. Then, the controller 7 sends the control signal $S_{CON2}$ to the voltage controller 3 so that the latch circuit 4 outputs the output signal $S_{LC}$ equal to the logic H level voltage $V_H$, i.e., $V_{CC}$. Here, the base voltage of the bipolar transistor 43 in the latch circuit 4 is set as a specific positive value allowing the base-to-emitter voltage of the transistor 43 to be approximately equal to 0 (i.e., the transistor 43 is turned ON) for this purpose.

Thus, when the MSB of the applied PCM input signal $S_{IN}$ has a value "1" (i.e., $b_3$=1), where the duty of the PWM pulse signal $SP_{PWM}$ is greater than 50%, the output signal $S_{LC}$ is always equal to $V_{CC}$. This is the same as the conventional D/A converter shown in FIG. 1.

When the MSB of the applied PCM input signal $S_{IN}$ has a value of "0" (i.e., $b_3$=0), where the duty of the PWM pulse signal $S_{PWM}$ is less than 50%, the operation is different from that of the conventional D/A converter shown in FIG. 1.

Specifically, when the MSB of the applied PCM input signal $S_{IN}$ has a value "0" (i.e., $b_3$=0), the third to first bits (excluding the MSB) $b_2$, $b_1$, and $b_0$ are shifted to the left by one bit and at the same time, a "0" is inserted in the first-bit space instead of the first bit $b_0$, as shown in FIG. 5B. As a result, a shifted serial bit data of [$b_2$, $b_1$, $b_0$, 0] is obtained.

In this case, as clearly seen, the value of the shifted serial bit data of [$b_2$, $b_1$, $b_0$, 0] is equal to twice as much as that of the original (non-shifted) serial bit data of [$b_3$, $b_2$, $b_1$, $b_0$].

The shifted serial bit data $S_{12}$ of [$b_2$, $b_1$, $b_0$, 0] are converted to the shifted parallel bit data of [$b_2$, $b_1$, $b_0$, 0] by the shift register 13. Then, the shifted parallel bit data of [$b_2$, $b_1$, $b_0$, 0] is applied to the counter 21 of the PWM circuit 2 as the final count value.

After the count of the counter 21 is reset by the sampling signal $S_{SMP}$, the counter 21 starts to count the pulses of the clock signal $S_{CLC}$ upward from the initial value (e.g., 0) until the count value is equal to the final value (i.e., the value represented by the shifted parallel bit data of [$b_2$, $b_1$, $b_0$, 0]) during each sampling period T.

Since the shifted parallel bit data of [$b_2$, $b_1$, $b_0$, 0] has a value equal to twice as much as that of the non-shifted parallel bit data of [$b_3$, $b_2$, $b_1$, $b_0$], the duty of the pulsed PWM output signal $S_{PWM}$ is equal to 2T', as shown in FIG. 3E.

During the counting operation, the PWM output signal $S_{PWM}$ is kept in the logic L level, thereby holding the output signal $S_{LC}$ of the latch circuit 4 in the logic H level. This is the same as the case where the MSB has a value "1".

On the other hand, the fact that the MSB of the PCM input signal $S_{IN}$ has a value "0" (i.e., $b_3$=0) is transmitted to the controller 7 through the control signal $S_{CON1}$. Then, the controller 7 sends the control signal $S_{CON2}$ to the voltage controller 3 so that the latch circuit 4 outputs the output signal $S_{LC}$ of ($V_{CC}/2$). Here, the base voltage of the bipolar transistor 43 in the latch circuit 4 is set as a specific positive value allowing the emitter-collector voltage of the transistor 43 is equal to ($V_{CC}/2$) for this purpose.

Thus, when the MSB of the applied PCM input signal $S_{IN}$ has a value "0" (i.e., $b_3$=0), the output signal $S_{LC}$ is equal to ($V_{CC}/2$) while the duty of the PWM signal $S_{PWM}$ is equal to 2T' (<T), as shown in FIG. 3E. In this case, the analog output signal $S_{OUT}$ has a waveform shown in FIG. 3F, in which only a slight ripple is observed at each sample.

In the conventional D/A converter shown in FIG. 1, when the MSB of the applied PCM input signal $S_{IN}$ has a value "0" (i.e., $b_3$=0), the output signal $S_{LC}$ is equal to $V_{CC}$ and the duty of the pulsed PWM signal $S_{PWM}$ is equal to T' (<T/2), as shown in FIG. 3C.

As described above, with the D/A converter according to the first embodiment, when the pulse width of the pulsed PWM signal $S_{PWM}$ is equal to T' whose duty is less than 50%, the voltage or amplitude of the output signal $S_{LC}$ of the latch circuit 4 is decreased to ($V_{CC}/2$) and at the same time, the duty of the output signal $S_{LC}$ is increased to 2T', as shown in FIGS. 3E and 4C.

Accordingly, as shown in FIG. 3F, the resultant analog output signal $S_{OUT}$ includes smaller ripples than those of the conventional D/A converter shown in FIG. 3D. This means that the rotation unevenness of a motor is reduced.

Also, as seen from FIGS. 4B and 4C, the rectangular pulse in FIG. 4C has an area of [2T'×($V_{CC}/2$)]=(T'×$V_{CC}$). On the other hand, the rectangular pulse in FIG. 4B has an area of $(T \times V_{CC})$. Thus, the rectangular pulse shown in FIG. 4C has an equal area to the rectangular pulse shown in FIG. 4B and therefore, the resultant analog signal $S_{OUT}$ has the same waveform in both cases shown in FIGS. 4B and 4C. This means that no change or error occurs in the D/A converter according to the first embodiment shown in FIG. 2.

The resolution of D/A conversion is defined as the quantization step (i.e., the minimum increment or decrement) of the variable pulse width of the PWM output signal $S_{PWM}$ of the PWM circuit 2. In the conventional D/A converter shown in FIG. 1, the quantization step is one fourth (¼) of the whole pulse width T', as shown in FIG. 4B. On the other hand, in the D/A converter according to the first embodiment shown in FIG. 2, the quantization step is one eighth (⅛) of the whole pulse width 2T', as shown in FIG. 4C. This means that the quantization step or resolution of the D/A converter according to the first embodiment is twice as much as that of the conventional D/A converter.

Figure 6:
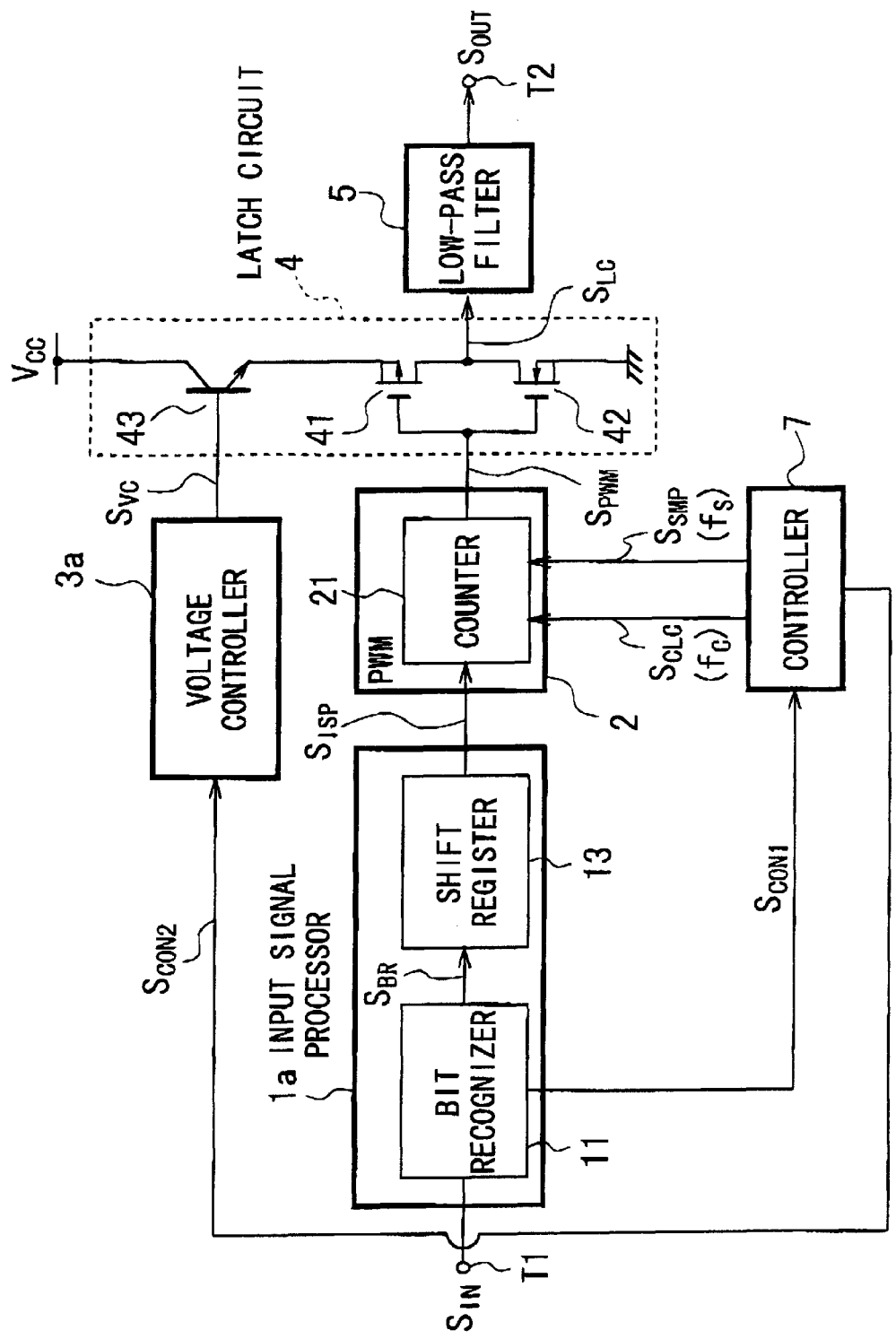
FIG. 6 is a block diagram showing a D/A converter according to a second embodiment of the present invention.

FIG. 6 shows a D/A converter according to a second embodiment of the present invention, which is a variation of the first embodiment. In this embodiment, unlike the first embodiment where the output signal $S_{LC}$ of the latch circuit 4 is changed between the two values, the output signal $S_{LC}$ of the latch circuit 4 is changed among seven values.

As shown in FIG. 6, the D/A converter according to the second embodiment is comprised of an input signal processor 1a, a PWM circuit 2 including a counter 21, a voltage controller 3a, a latch circuit 4 serving as a S/H circuit, and a LPF circuit 5. Reference symbols T1 and T2 denote input and output terminals of the D/A converter, respectively.

Since the PWM circuit 2, the latch circuit 4, and the LPF circuit 5 are the same as those in the first embodiment shown in FIG. 2, no explanation about them is provided here for the sake of simplification.

The operation of the D/A converter according to the second embodiment is approximately the same as that of the D/A converter according to the first embodiment except for the following difference.

Figure 7A:
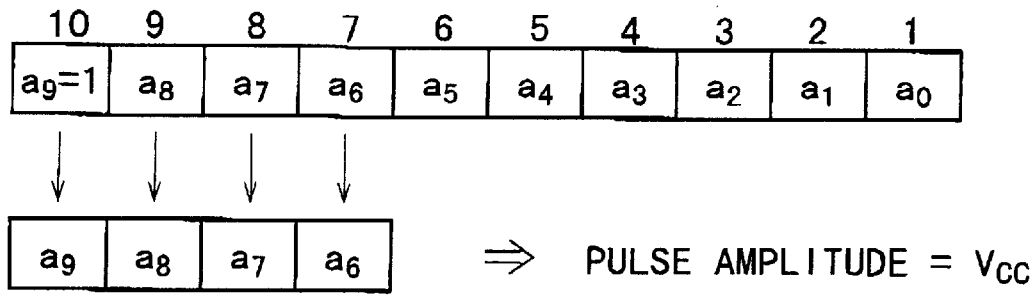
FIGS. 7A to 7C are schematic diagrams showing the shift of the bits of the PCM input signal in the operation of the D/A converter according to the second embodiment, respectively.
Figure 7B:
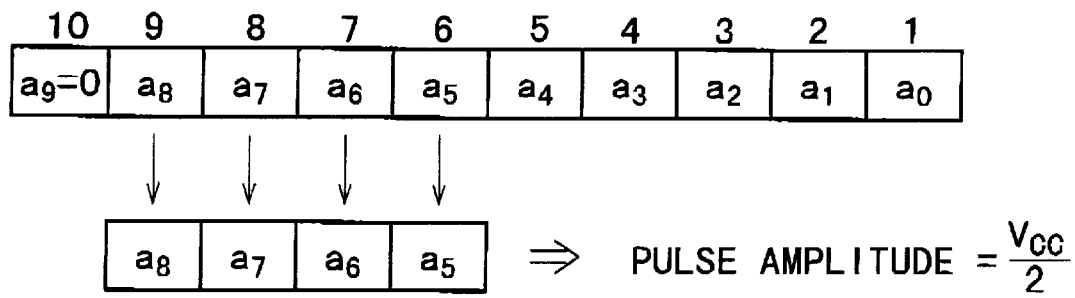
Figure 7C:
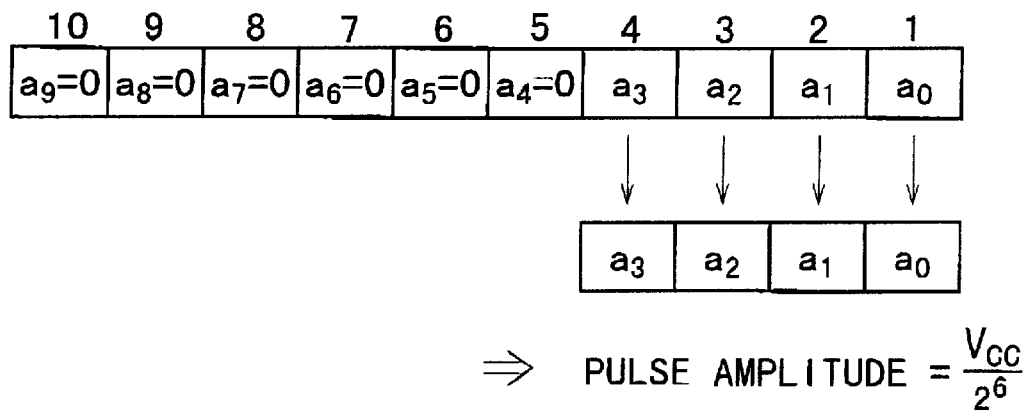

Specifically, in the second embodiment, it is supposed that the digital input signal $S_{IN}$ formed by a stream of the PCM coding pulses is a 10-bit signal of bits $a_9, a_8, a_7, a_6, a_5, a_4, a_3, a_2, a_1$, and $a_0$, as shown in FIGS. 7A to 7C. Here, the format of the signal $S_{IN}$ is represented as $[a_9, a_8, a_7, a_6, a_5, a_4, a_3, a_2, a_1, a_0]$. The MSB is the bit $a_9$ and the LSB is the bit $a_0$.

The input signal processor 1a has a bit recognizer 11 and a 4-bit shift register 13.

The bit recognizer 11 checks the bits of the input signal $S_{IN}$ from the MSB toward the LSB and recognizes the bit number of a "1"-valued one of the bits.

In detail, first, it is checked whether the tenth bit or MSB $a_9$ of the input signal $S_{IN}$ has a value "1" or not. If the MSB $a_9$ has a value "1", the checking operation is finished at that stage. Subsequently, the uppermost four (i.e., tenth, ninth, eighth, and seventh) bits $a_9, a_8, a_7$, and $a_6$ are transmitted to the 4-bit shift register 13 as a serial bit data, as shown in FIG. 7A.

In this case, the duty of the PWM pulse signal $S_{PWM}$ is equal to T'.

If the MSB $a_9$ has a value "0", it is then checked whether the ninth bit $a_8$ of the input signal $S_{IN}$ has a value "1" or not. If the ninth bit $a_8$ has a value "1", the checking operation is finished at that stage. Subsequently, the ninth to sixth bits $a_8, a_7, a_6$, and $a_5$ are transmitted to the shift register 13 as the serial bit data, as shown in FIG. 7B.

In this case, as clearly seen the value of the serial bit data of $[a_8, a_7, a_6, a_5]$ is equal to twice as much as of that of the original (non-shifted) serial bit data of $[a_9, a_6, a_7, a_6]$. Thus, the duty of the PWM output signal $S_{PWM}$ is equal to 2T'.

If the ninth bit $a_8$ has a value "0", then, it is checked whether the eighth bit $a_7$ of the input signal $S_{IN}$ has a value "1" or not. If the eighth bit $a_7$ has a value "1", the checking operation is finished at that stage. Subsequently, the eighth to fifth bits $a_7, a_6, a_5$, and $a_4$ are transmitted to the shift register 13 as the serial bit data.

In this case, as clearly seen, the value of the serial bit data of $[a_7, a_6, a_5, a_4]$ is equal to four times as much as that of the original (non-shifted) serial bit data of $[a_9, a_8, a_7, a_6]$. Thus, the duty of the PWM output signal $S_{PWM}$ is equal to 4T'.

If the eighth bit $a_7$ has a value "0", then, it is checked whether the seventh bit $a_6$ of the input signal $S_{IN}$ has a value "1" or not. If the seventh bit $a_6$ has a value "1", the checking operation is finished at that stage. Subsequently, the seventh to fourth bits $a_6, a_5, a_4$, and $a_3$ are transmitted to the shift register 13 as the serial bit data.

In this case, as clearly seen, the value of the serial bit data of $[a_6, a_5, a_4, a_3]$ is equal to eight times as much as that of the original (non-shifted) serial bit data of $[a_9, a_8, a_7, a_6]$. Thus, the duty of the PWM output signal $S_{PWM}$ is equal to 8T'.

If the seventh bit $a_6$ has a value "0", then, it is checked whether the sixth bit $a_5$ of the input signal $S_{IN}$ has a value "1" or not. If the sixth bit $a_5$ has a value "1", the checking operation is finished at that stage. Subsequently, the sixth to third bits $a_5, a_4, a_3$, and $a_2$ are transmitted to the shift register 13 as the serial bit data.

In this case, as clearly seen, the value of the serial bit data of $[a_5, a_4, a_3, a_2]$ is equal to sixteen times as much as that of the original (non-shifted) serial bit data of $[a_9, a_8, a_7, a_6]$. Thus, the duty of the PWM output signal $S_{PWM}$ is equal to 16T'.

If the sixth bit $a_5$ has a value "0", then, it is checked whether the fifth bit $a_4$ of the input signal $S_{IN}$ has a value "1" or not. If the fifth bit $a_4$ has a value "1", the checking operation is finished at that stage. Subsequently, the fifth to second bits $a_4, a_3, a_3$, and $a_1$ are transmitted to the shift register 13 as the serial bit data.

In this case, as clearly seen, the value of the serial bit data of $[a_4, a_3, a_2, a_1]$ is equal to thirty-two times as much as that of the original (non-shifted) serial bit data $S_{BR}$ of $[a_9, a_8, a_7, a_6]$. Thus, the duty of the PWM output signal $S_{PWM}$ is equal to 32T'.

If the fifth bit $a_4$ has a value "0", no further checking operation is performed and then, the fourth to first bits $a_3, a_2, A_1$, and $a_0$ are transmitted to the shift register 13 as the serial bit data, as shown in FIG. 7C.

In this case, as clearly seen, the value of the serial bit data of $[a_3, a_2, a_1, a_0]$ is equal to sixty-four times as much as that of the original (non-shifted) serial bit data $S_{BR}$ of $[a_9, a_8, a_7, a_6]$. Thus, the duty of the PWM output signal $S_{PWM}$ is equal to 64T'.

According to the above-described bit-checking result of the input signal $S_{IN}$, the bit recognizer 11 sends a control signal $S_{CON1}$ to the controller 7 which is typically formed by a CPU or DSP. In response to the control signal $S_{CON1}$, the controller 7 sends a control signal $S_{CON2}$ to the voltage controller 3a, thereby setting the voltage value of the output signal $S_{LC}$ of the latch circuit 4 according to the bit-checking result by the bit recognizer 11.

That is, when the tenth bit or MSB $a_9$ of the input signal $S_{IN}$ has a value "1", where the serial bit data of $[a_9, a_8, a_7,$ $a_6$] are transmitted, the voltage value of the output signal $S_{LC}$ is set as $V_{CC}$, as shown in FIG. 7A. Since the duty of the PWM output signal $S_{PWM}$ is equal to T', the pulse area of the PWM signal $S_{PWM}$ is expressed as (T'×$V_{CC}$).

When the tenth bit or MSB $a_9$ of the input signal $S_{IN}$ has a value "0", where the serial bit data of [$a_8$, $a_7$, $a_6$, $a_5$] are transmitted, the voltage value of the output signal $S_{LC}$ is set as ($V_{CC}/2$), as shown in FIG. 7B. Since the duty of the PWM output signal $S_{PWM}$ is equal to 2T', the pulse area of the PWM signal $S_{PWM}$ is expressed as [2T'×($V_{CC}/2$)] which is equal to (T'×$V_{CC}$) corresponding to the case where the MSB $a_9$ of the input signal $S_{IN}$ has a value "1". This means that no error or change occurs in the analog output signal $S_{OUT}$ even in this case.

When the ninth bit $a_8$ of the input signal $S_{IN}$ has a value "0", where the serial bit data of [$a_7$, $a_6$, $a_5$, $a_4$] are transmitted, the voltage value of the output signal $S_{LC}$ is set as ($V_{CC}/4$). Since the duty of the PWM output signal $S_{PWM}$ is equal to 4T', the pulse area of the PWM signal $S_{PWM}$ is expressed as [4T'×($V_{CC}/4$)] which is equal to (T'×$V_{CC}$) corresponding to the case where the MSB $a_9$ of the input signal $S_{IN}$ has a value "1". This means that no error or change occurs in the analog output signal $S_{OUT}$ even in this case.

When the eighth bit $a_7$ of the input signal $S_{IN}$ has a value "0", where the serial bit data of [$a_6$, $a_5$, $a_4$, $a_3$] are transmitted, the voltage value of the output signal $S_{LC}$ is set as ($V_{CC}/8$). Since the duty of the PWM output signal $S_{PWM}$ is equal to 8T', the pulse area of the PWM signal $S_{PWM}$ is expressed as [8T'×($V_{CC}/8$)] which is equal to (T'×$V_{CC}$) corresponding to the case where the MSB $a_9$ of the input signal $S_{IN}$ has a value "1". This means that no error or change occurs in the analog output signal $S_{OUT}$ even in this case.

When the seventh bit $a_6$ of the input signal $S_{IN}$ has a value "0", where the serial bit data of [$a_5$, $a_4$, $a_3$, $a_2$] are transmitted, the voltage value of the output signal $S_{LC}$ is set as ($V_{CC}/16$). Since the duty of the PWM output signal $S_{PWM}$ is equal to 16T', the pulse area of the PWM signal $S_{PWM}$ is expressed as [16T'×($V_{CC}/16$)] which is equal to (T'×$V_{CC}$) corresponding to the case where the MSB $a_9$ of the input signal $S_{IN}$ has a value "1". This means that no error or change occurs in the analog output signal $S_{OUT}$ even in this case.

When the sixth bit $a_5$ of the input signal $S_{IN}$ has a value "0", where the serial bit data of [$a_4$, $a_3$, $a_2$, $a_1$] are transmitted, the voltage value of the output signal $S_{LC}$ is set as ($V_{CC}/32$). Since the duty of the PWM output signal $S_{PWM}$ is equal to 32T', the pulse area of the PWM signal $S_{PWM}$ is expressed as [32T'×($V_{CC}/32$)] which is equal to (T'×$V_{CC}$) corresponding to the case where the MSB $a_9$ of the input signal $S_{IN}$ has a value "1". This means that no error or change occurs in the analog output signal $S_{OUT}$ even in this case.

When the fifth bit $a_4$ of the input signal $S_{IN}$ has a value "0", where the serial bit data of [$a_3$, $a_2$, $a_1$, $a_0$] are transmitted, the voltage value of the output signal $S_{LC}$ is set as ($V_{CC}/64$), as shown in FIG. 7C. Since the duty of the PWM output signal $S_{PWM}$ is equal to 64T', the pulse area of the PWM signal $S_{PWM}$ is expressed as [64T'×($V_{CC}/64$)] which is equal to (T'×$V_{CC}$) corresponding to the case where the MSB $a_9$ of the input signal $S_{IN}$ has a value "1". This means that no error or change occurs in the analog output signal $S_{OUT}$ even in this case.

The voltage controller $3a$ necessitating the output of seven different voltage values $V_{CC}$, ($V_{CC}/2$), ($V_{CC}/4$), ($V_{CC}/8$), ($V_{CC}/16$), ($V_{CC}/32$), and ($V_{CC}/64$) may be readily realized by the use of a known circuit such as a R-2R ladder circuit.

The shift register 13 receives and converts the serial bit data transmitted from the bit recognizer 11 to a parallel bit data. The parallel bit data of the input signal $S_{IN}$ is sent to the PWM circuit 21 as an output signal $S_{ISP}$ of the input signal processor 1. The operation of the shift register 13 is the same as that in the first embodiment.

The PWM circuit 2 includes a 4-bit counter 21 for counting the number of an applied, pulsed clock signal $S_{CLC}$ with a clock frequency $f_C$. The operation of the counter 21 is the same as that in the first embodiment. A pulsed clock signal $S_{CLC}$ and a pulsed sampling signal $S_{SMP}$ are generated by the controller 7, which is the same as that in the first embodiment.

The counter 21 outputs an output signal $S_{PWM}$ with a variable pulse width to the latch circuit 4. The pulse width of the output signal $S_{PWM}$ at each quantized sample is proportional to the amplitude of the original analog signal at each sample.

During the counting operation, the output signal $S_{PWM}$ of the counter 21 is in the logic L level, so that an output signal $S_{LC}$ of the latch circuit 4 has a voltage value ($V_H$) corresponding to the logic H level of the latch circuit 4. Unlike the first embodiment, the voltage value is equal to one of the seven preset values $V_{CC}$, ($V_{CC}/2$), ($V_{CC}/4$), ($V_{CC}/8$), ($V_{CC}/16$), ($V_{CC}/32$), and ($V_{CC}/64$), as described above. After the counting operation is finished, the output signal $S_{PWM}$ of the counter 21 is in a logic H level, so that the output signal $S_{LC}$ of the latch circuit 4 has a voltage value ($V_L$) corresponding to the logic L level of the latch circuit 4, i.e., 0 (V).

With the D/A converter according to the second embodiment, as explained above, the 10-bit PCM-coded input signal $S_{IN}$ is converted by the use of the 4-bit shift register 13 in the input signal processor 1 and the 4-bit counter 21 in the PWM circuit 2 without increasing the clock frequency $f_C$.

In other words, the 10-bit dynamic range is realized by the use of the 4-bit shift register 13 and the 4-bit counter 21. This means that the D/A conversion of the 10-bit PCM-coded input signal $S_{IN}$ is able to be accomplished by the counter clock signal $S_{CLC}$ having the clock frequency $f_C$ equal to $2^4$ (=16) times as much as the sampling frequency $f_S$.

On the other hand, in the conventional D/A converter shown in FIG. 1, the counter clock signal $S_{CLC}$ needs to have the clock frequency $f_C$ equal to $2^{10}$ (=1024) times as much as the sampling frequency $f_S$ for this purpose.

In the second embodiment, the 10-bit PCM-coded input signal $S_{IN}$, the 4-bit shift register 13, and the 4-bit counter 21 are used. However, it is needless to say that the present invention is not limited to this case.

Figure 7D:
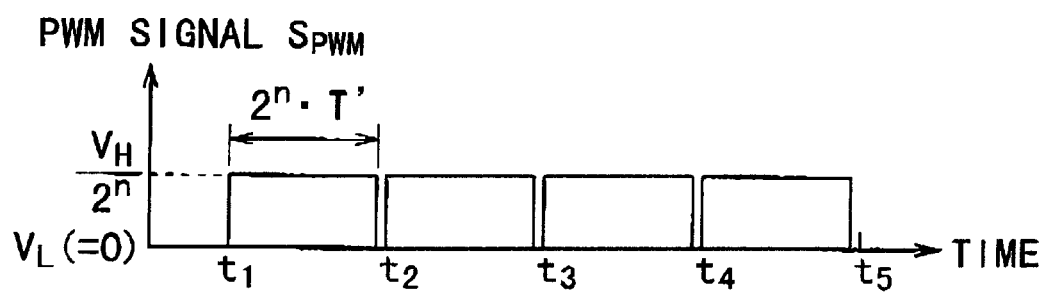
FIG. 7D is a timing diagram showing the PWM output signal $S_{PWM}$ of the D/A converter according to the second embodiment.

If the PCM-coded input signal $S_{IN}$ is a k-bit signal and the maximum output voltage $V_{CC}$ of the latch circuit 4 is quantized to $2^n$ steps, where k and n are natural numbers and k is greater than n (i.e., k>n), it is sufficient that the bit number of the counter 21 is set as (k+1−n). In this case, as shown in FIG. 7D, the area of each pulse of the PWM signal $S_{PWM}$ is expressed as [$2^n$·T'×($V_{CC}/2^n$)], which is always equal to the original pulse area (T'×$V_{CC}$).

Unlike the first embodiment where the output signal $S_{LC}$ of the latch circuit 4 may have two values of $V_{CC}$ and ($V_{CC}/2$), the output signal $S_{LC}$ may have (n+1) non-zero values of $V_{CC}$, ($V_{CC}/2$), ($V_{CC}/4$), . . . , and ($V_{CC}/2^n$) in the second embodiment.

In the second embodiment, the ripples occurring in the analog output signal $S_{OUT}$ are smaller than those in the first embodiment.

Figure 8:
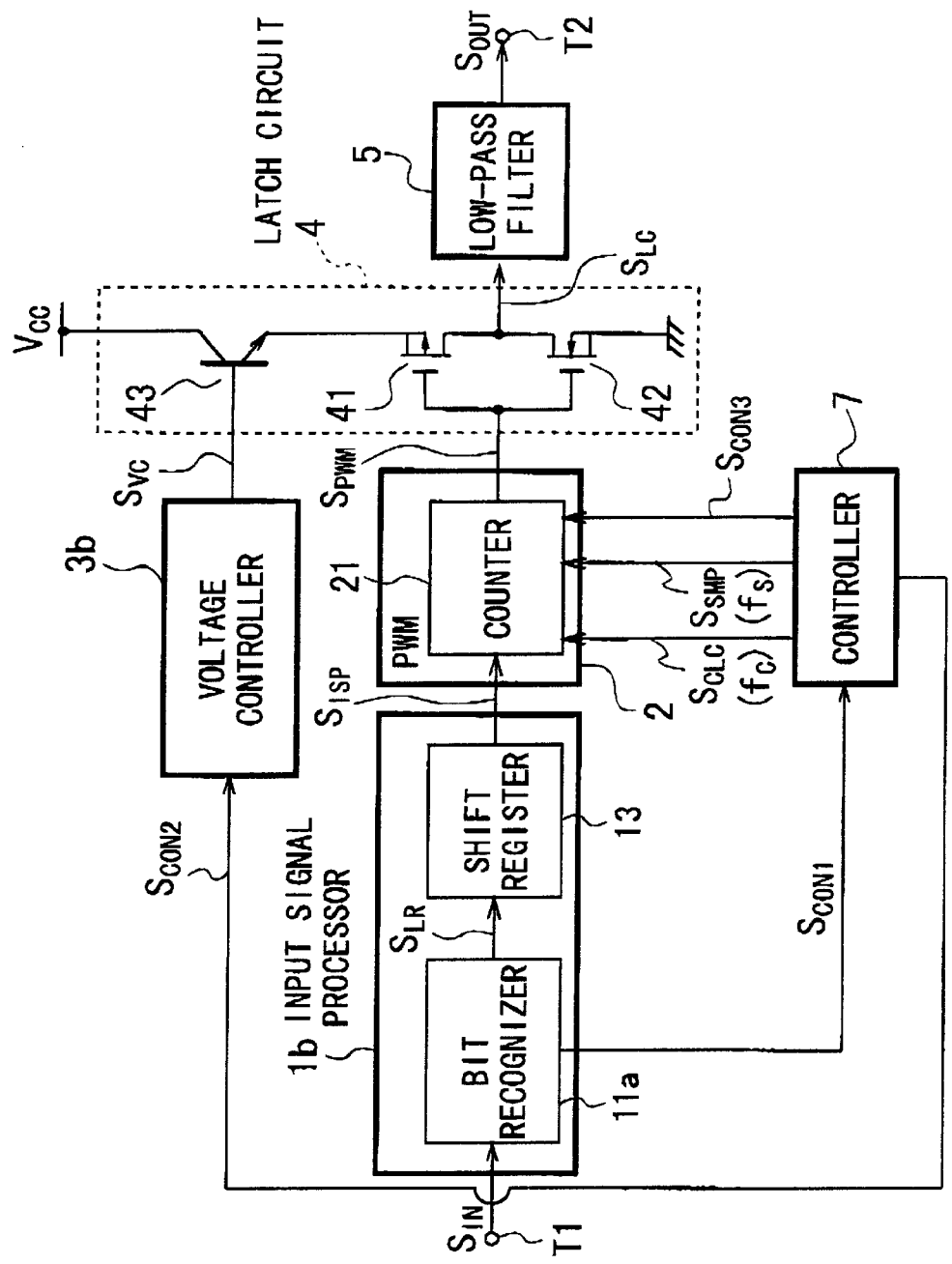
FIG. 8 is a block diagram showing a D/A converter according to a third embodiment of the present invention.

FIG. 8 shows a D/A converter according to a third embodiment of the present invention, which is another variation of the first embodiment.

Unlike the first and second embodiments where each pulse of the PWM signal $S_{PWM}$ has a fixed voltage level over its whole width, each pulse of the PWM signal $S_{PWM}$ has a variable voltage level within its whole width.

Figure 9:
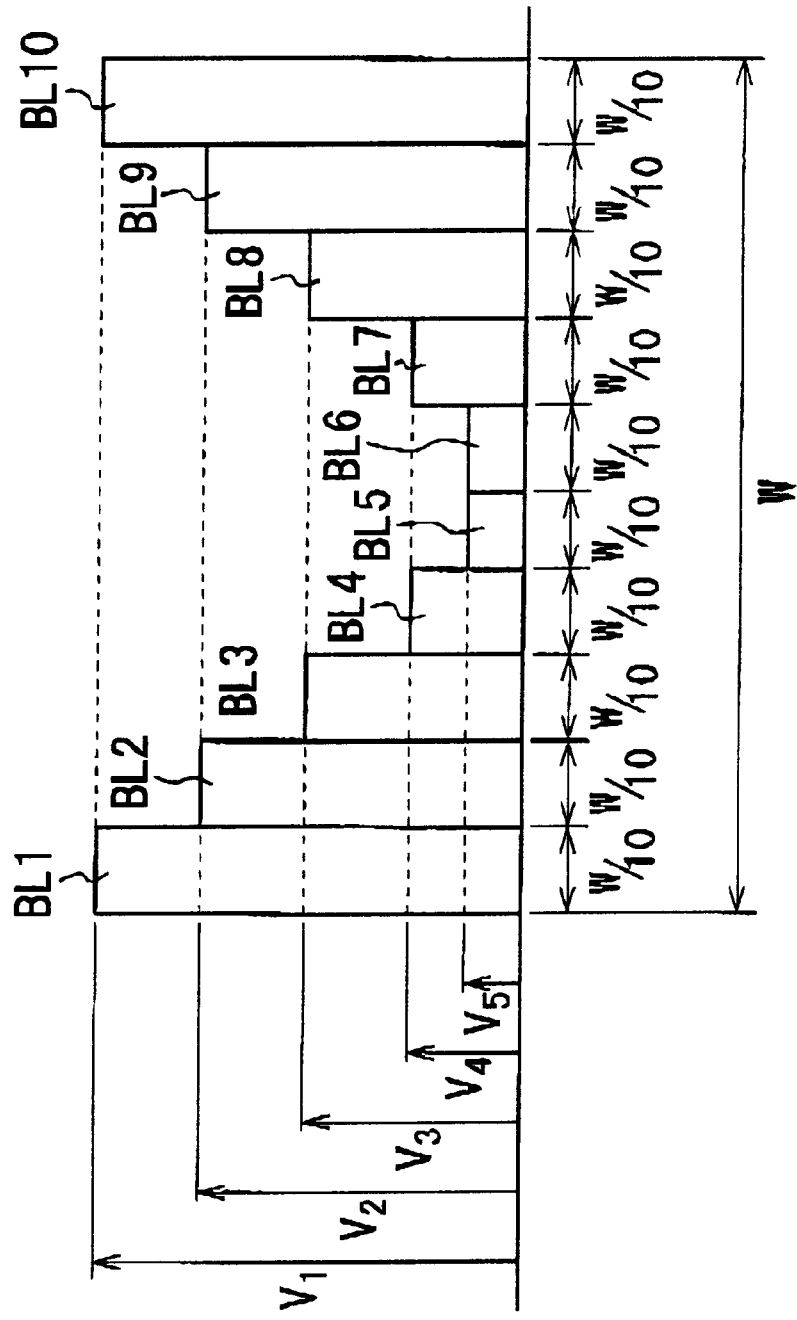
FIG. 9 is a waveform diagram showing the pulse of the PWM output $S_{PWM}$ signal used in the D/A converter according to the third embodiment.

Specifically, as shown in FIG. 9, each pulse of the PWM signal $S_{PWM}$ is symmetrically and equally divided into ten blocks BL1, BL2, BL3, BL4, BL5, BL6, BL7, BL8, BL9, and BL10 with respect to its vertical center line. Therefore, when the pulse of the PWM signal $S_{PWM}$ has a variable width W, each of the blocks BL1, BL2, BL3, BL4, BL5, BL6, BL7, BL8, BL9, and BL10 has a same width (W/10).

The two blocks BL1 and BL10, which are located at each end of the pulse, have a same voltage value $V_1$. The two blocks BL2 and BL9, which are located adjacent to the corresponding blocks BL1 and BL10, have a same voltage value $V_2$ less than $V_1$. The two blocks BL3 and BL8, which are located adjacent to the corresponding blocks BL2 and BL9, have a same voltage value $V_3$ less than $V_2$. The two blocks BL4 and BL7, which are located adjacent to the corresponding block BL3 and BL8, have a same voltage value $V_4$ less than $V_3$. The two blocks BL5 and BL6, which are located adjacent to the corresponding blocks BL4 and BL7 at the middle of the pulse, have a same voltage value $V_5$ less than $V_4$.

Figure 11A:
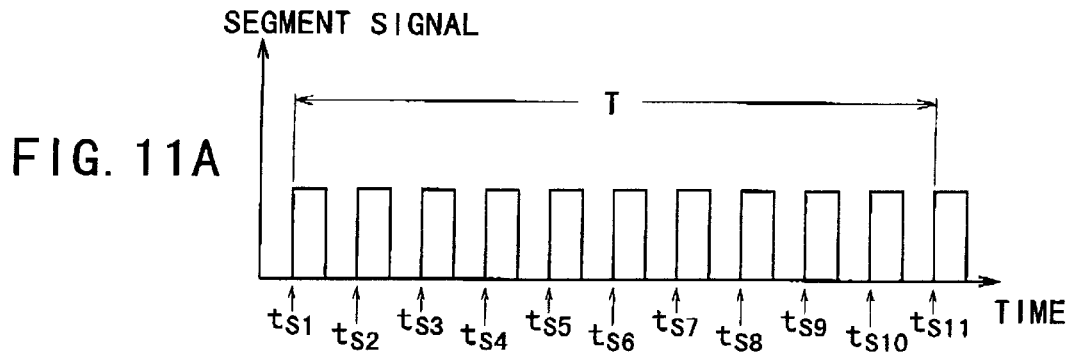
FIG. 11A is a timing diagram showing the segment signal used in the D/A converter according to the third embodiment.
Figure 11B:
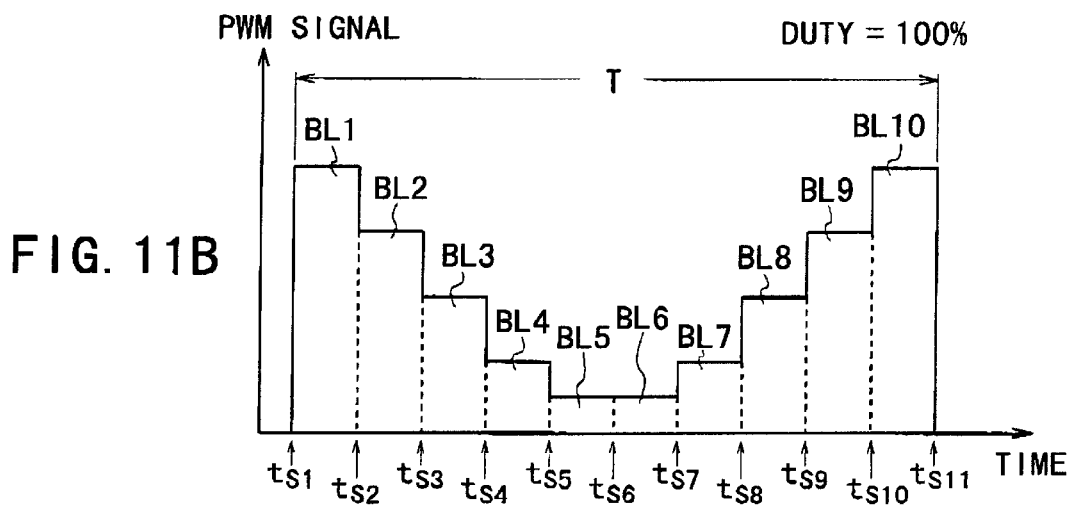
FIG. 11B is a timing diagram showing the PWM output signal $S_{PWM}$ used in the D/A converter according to the third embodiment, in which the duty of the PWM output signal $S_{PWM}$ is 100%.

If the duty of the pulse of the PWM signal $S_{PWM}$ is 100%, the pulse has a waveform as shown in FIG. 11B. This waveform includes the ten blocks BL1 to BL10 corresponding to ten pulses of a segment signal shown in FIG. 11A. Each of the ten blocks BL1 to BL10 is formed to be synchronized with each pulse of the segment signal. The reference symbols $t_{s1}$ to $t_{s11}$ denote the time at which each pulse of the segment signal is applied to the counter 21.

Figure 11C:
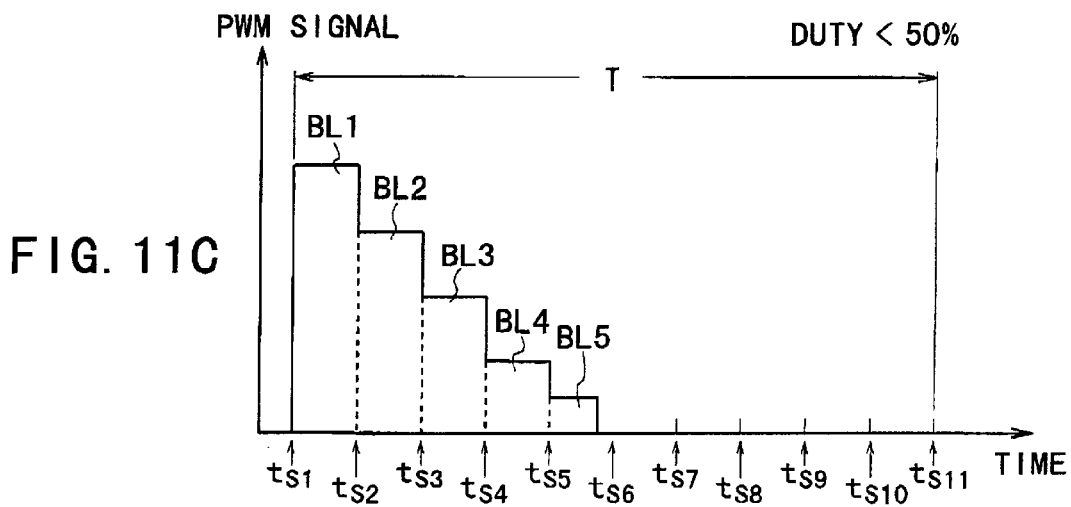
FIG. 11C is a timing diagram showing the PWM output signal $S_{PWM}$ used in the D/A converter according to the third embodiment, in which the duty of the PWM output signal $S_{PWM}$ is less than 50%.

If the duty of the pulse of the PWM signal $S_{PWM}$ is less than 50%, the pulse has a waveform as shown in FIG. 11C, which includes the four blocks BL1 to BL4 and a half of the block BL5 corresponding to four pulses and a half of the segment signal.

The D/A converter according to the third embodiment capable of the above-identified operation has the configuration shown in FIG. 8, in which a PWM circuit 2 including a counter 21, a latch circuit 4 serving as a S/H circuit, and a low-pass filter 5 are the same as those in the first embodiment.

Unlike the first and second embodiments, in the third embodiment, the input signal $S_{IN}$ is a PCM signal encoded according to the logarithmic compression code "μ-law" or "A-law". Each sample of the input signal $S_{IN}$ has a sign bit, segment bits, and step (or quantization) bits.

An input signal processor 1b includes a bit recognizer 11a and a shift register 13.

The bit recognizer 11a checks the sign bit, the segment bits, and the step bits of the input signal $S_{IN}$ and recognizes the polarity from the sign bit, the segment number representing one of the ten segments BL1 to BL10 from the segment bits, and the voltage value from $V_1$ to $V_5$ from the step bits.

Then, the recognizer 11a transmits the polarity, segment, and step bit data of the signal $S_{IN}$ to the shift register 13 as an output signal $S_{ISP}$ of the input signal processor 1b. Subsequently, in the same way as the first embodiment, the output signal $S_{ISP}$ is applied to the counter 21 of the PWM circuit 2 and outputs the PWM output signal $S_{PWM}$ to the latch circuit 4. Thus, the PWM output signal $S_{PWM}$ is kept in the logic L level during a period corresponding to the pulse width of the signal $S_{PWM}$.

On the other hand, the bit recognizer 11a transmits a control signal $S_{CON1}$ advising the specified voltage values for the corresponding pulse blocks to the controller 7. In response to this control signal $S_{CON1}$, the controller 7 sends a control signal $S_{CON2}$ to the voltage controller 3b, thereby causing the latch circuit 4 to output one of the specified voltage values $V_1$ to $V_5$ synchronized with a corresponding one of the blocks BL1 to BL10.

The above-described segment signal, which is produced in the controller 7, is sent to the voltage controller 3b along with the control signal $S_{CON2}$ and to the counter 21 through a control signal $S_{CON3}$. Each of the blocks BL1 to BL10 is generated synchronized with the segment signal.

The voltage controller 3b necessitating the output of five different voltage values $V_1$, $V_2$, $V_3$, $V_4$, and $V_5$ may be readily realized by the use of a known circuit such as a R-2R ladder circuit or the like.

Figure 10:
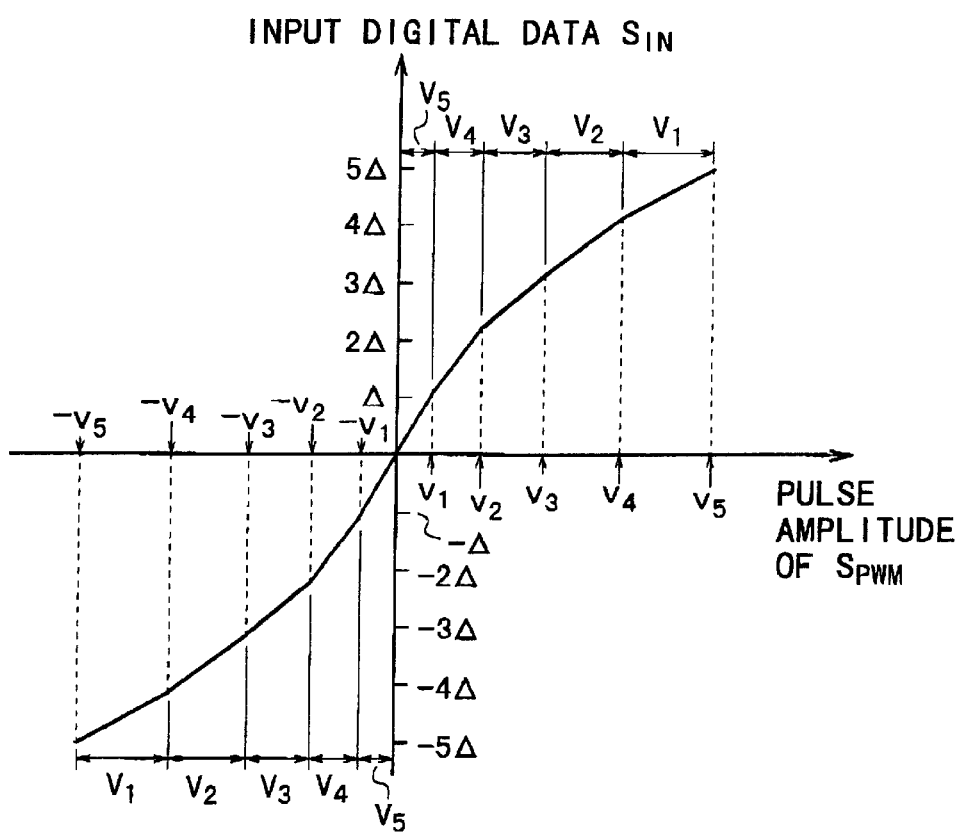
FIG. 10 is a graph showing the transfer characteristic of the D/A converter according to the third embodiment, in which the abscissa is the pulse amplitude of the PWM output signal $S_{PWM}$ and the ordinate is the data of the input digital signal $S_{IN}$.

FIG. 10 shows the transfer (or, input-output) characteristic of the PWM circuit 2, in which the ordinate is the input digital data of the input signal $S_{IN}$ and the abscissa is the pulse amplitude of the PWM output signal $S_{PWM}$.

In FIG. 10, the ordinate is equally or linearly divided into ten steps of 5Δ, 4Δ, 3Δ, 2Δ, Δ, -Δ, -2Δ, -3Δ, -4Δ, and -5Δ, where Δ is the quantization step of the amplitude of the original analog signal. The abscissa is unequally or logarithmically divided into ten voltage steps of $V_5$, $V_4$, $V_3$, $V_2$, $V_1$, $-V_1$, $-V_2$, $-V_3$, $-V_4$, and $-V_5$. These ten voltage steps are designed to logarithmically decrease from $V_5$ to $-V_5$. Thus, the transfer characteristic shown in FIG. 10 is a logarithmic characteristic produced by the use of the segment approximation.

Due to this logarithmic characteristic, the input digital data $S_{IN}$ is logarithmically expanded by the PWM circuit 2 and is outputted through the latch circuit 4 and the LPF circuit 5.

For example, when the pulse of the signal $S_{PWM}$ has the waveform shown in FIG. 11C, first, the block BL1 is specified. Then, the voltage value of the pulse of the output signal $S_{LC}$ of the latch circuit 4 is set as $V_1$ by the voltage controller 3b through the control signals $S_{CON1}$ and $S_{CON2}$. The pulse width of the SWP signal $S_{PWM}$ is set as (W/10) by counting the number from a specific initial value to a specific final value corresponding to a width of (W/10) in the counter 21.

Next, the block BL2 is specified. Then, the voltage value of the pulse of the output signal $S_{LC}$ of the latch circuit 4 is set as $V_2$ by the voltage controller 3b through the control signals $S_{CON1}$ and $S_{CON2}$. The pulse width of the SWP signal $S_{PWM}$ is set as (W/10) by counting the number form the specific initial value to the same specific final value corresponding to the width of (W/10) in the counter 21.

Further, in the same way as above, the blocks BL3 and BL4 are successively produced.

Finally, the block BL5 is specified. Then, the voltage value of the pulse of the output signal $S_{LC}$ of the latch circuit 4 is set as $V_5$ by the voltage controller 3b through the control signals $S_{CON1}$ and $S_{CON2}$. The pulse width of the SWP signal $S_{PWM}$ is set as (W/20) by counting the number from the specific initial value to a specific final value corresponding to a width of (W/20) in the counter 21.

Thus, the pulse of the signal $S_{PWM}$ having the waveform shown in FIG. 11C is produced.

With the D/A converter according to the third embodiment, as explained above, the PCM input signal $P_{IN}$ is logarithmically compressed in an A/D conversion process.

Therefore, it has the "sign bit" representing the polarity of the original analog signal at each sample, the "segments bits" representing the segment number or location of the original analog signal at each sample, and the "step bits" representing the step number or location of the original analog signal at each sample.

If the segments and voltage values in each pulse of the PWM signal $S_{PWM}$ are designed to satisfy the μ-law or A-law compression code, the D/A converter according to the third embodiment is capable of expansion of the logarithmically-compressed input signal $S_{IN}$ according to the μ-law or A-law compression code.

If the PCM input signal $P_{IN}$ is linearly quantized, the voltage value of each pulse of the PWM signal $S_{PWM}$ is fixed at a value by changing the operation of the voltage controller 3b and the controller 7. In this case, this D/A converter is capable of a same operation as those in the first and second embodiments.

The operation of switching between the linear and logarithmic expansions may be readily realized by sending a suitable control signal to the level recognizer 11 and the voltage controller 3b. The control signal is typically produced by the controller 7.

Although the width of the blocks BL1 to BL10 are equal to (W/10) in the third embodiment, they may have any other same value or different values as necessary.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A D/A conversion method comprising the steps of:
   (a) recognizing at least one bit of a digital input signal to thereby produce a pulse width signal and a control signal;
   (b) generating a PWM signal with a plurality of pulses each having a variable pulse width according to a value of said digital input signal; and
   (c) outputting an output pulse voltage according to said value of said digital input signal;
   wherein said variable pulse width of each of said plurality of pulses is controlled by said pulse width signal, and said output pulse voltage is controlled by said control signal; and
   wherein said variable pulse width and said output pulse voltage of each pulse of said plurality of pulses are changed in such a way that an area of each pulse of said plurality of pulses is equal to an area of every other pulse of said plurality of pulses.

2. The method as claimed in claim 1, wherein said output pulse voltage is controlled according to a duty of said each pulse.

3. The method as claimed in claim 2, wherein said output pulse voltage is controlled in such a way that said output pulse voltage has a half value of a maximum value when said duty of said PWM signal is less than 50%.

4. The method as claimed in claim 2, wherein said digital input signal is a k-bit signal, and said output pulse voltage is divided into $2^n$ steps, where k and n are natural numbers satisfying a relationship of k>n;
   wherein said variable pulse width of each of said plurality of pulses is divided into (k−n) bits; and
   wherein said output pulse voltage is controlled in such a way that said output pulse voltage has a value corresponding to one of said $2^n$ steps when a duty of an associated pulse of said plurality of pulses is less than 50%.

5. The method as claimed in claim 1, wherein each pulse of said PWM signal is divided into blocks having different values;
   and wherein said values of said blocks are designed to form a specific expansion characteristic.

6. The method as claimed in claim 5, wherein said values of said blocks are designed to form a logarithmic expansion characteristic.

7. The method as claimed in claim 1, wherein said outputting an output pulse voltage step outputs the output pulse voltage at one of at least three voltage levels.

8. The method as claimed in claim 1, wherein said recognizing at least one bit step recognizes a most significant bit of said digital input signal.

9. A D/A converter comprising:
   (a) a bit recognizer for recognizing at least one bit of a digital input signal to thereby produce a pulse width signal and a control signal;
   (b) a PWM signal generator for generating a PWM signal with a plurality of pulses each having a variable pulse width according to a value of said digital input signal; and
   (c) an output circuit for outputting an output pulse voltage according to said value of the digital input signal;
   wherein said variable pulse width of each of said plurality of pulses is controlled by said pulse width signal, and said output pulse voltage is controlled by said control signal; and
   wherein said variable pulse width and said output pulse voltage of each of said plurality of pulses are changed in such a way that an area of each pulse of said plurality of pulses is equal to an area of every other pulse of said plurality of pulses.

10. The converter as claimed in claim 9, wherein said output pulse voltage is controlled according to a duty of a pulse of said plurality of pulses.

11. The converter as claimed in claim 10, wherein said output pulse voltage is controlled in such a way that said output pulse voltage has a half value of a maximum value when said duty of said PWM signal is less than 50%.

12. The converter as claimed in claim 10, wherein said digital input signal is a k-bit signal, and said output pulse voltage is divided into $2^n$ steps, where k and n are natural numbers satisfying a relationship of k>n;
   wherein said variable pulse width of each of said plurality of pulses is divided into (k−n) bits; and
   wherein said output pulse voltage is controlled in such a way that said output pulse voltage has a value corresponding to one of said $2^n$ steps when a duty of a pulse of said plurality of pulses is less than 50%.

13. The converter as claimed in claim 9, wherein each pulse of said PWM signal is divided into blocks having different values;
   and wherein said values of said blocks are designed to form a specific expansion characteristic.

14. The converter as claimed in claim 13, wherein said values of said blocks are designed to form a logarithmic expansion characteristic.

15. The converter of claim 9, wherein said output circuit is controlled by said control signal to provide said output pulse voltage at one of at least three voltage levels.

16. The converter of claim 9, wherein said bit recognizer recognizes a most significant bit of said digital input signal.

* * * * *